United States Patent [19]
Brady

[11] Patent Number: 6,147,917
[45] Date of Patent: *Nov. 14, 2000

[54] APPARATUS AND METHOD FOR NOISE REDUCTION IN DRAM

[75] Inventor: James Brady, Plano, Tex.

[73] Assignee: STMicroelectronics, Inc., Carrollton, Tex.

[*] Notice: This patent issued on a continued prosecution application filed under 37 CFR 1.53(d), and is subject to the twenty year patent term provisions of 35 U.S.C. 154(a)(2).

[21] Appl. No.: 09/173,229

[22] Filed: Oct. 15, 1998

[51] Int. Cl.[7] .................................................. G11C 7/00
[52] U.S. Cl. ........................................ 365/206; 365/203
[58] Field of Search .................................. 365/206, 203, 365/189.09, 190

[56] References Cited

U.S. PATENT DOCUMENTS

| | | | |
|---|---|---|---|
| 4,138,740 | 2/1979 | Itoh | 365/203 |
| 5,140,557 | 8/1992 | Yoshida | 365/226 |
| 5,297,097 | 3/1994 | Etoh et al. | 365/226 |
| 5,412,606 | 5/1995 | Lee | 365/203 |
| 5,467,312 | 11/1995 | Albon et al. | 365/203 |
| 5,506,811 | 4/1996 | McLaury | 365/203 |
| 5,519,660 | 5/1996 | Iwahashi | 365/203 |
| 5,539,700 | 7/1996 | Kawahara et al. | 365/203 |
| 5,764,562 | 6/1998 | Hamamoto | 35/149 |
| 5,828,610 | 10/1998 | Rogers et al. | 365/203 |

FOREIGN PATENT DOCUMENTS 0 530 792 A2  10/1993  European Pat. Off. ................. 11/407

*Primary Examiner*—Son T. Dinh
*Attorney, Agent, or Firm*—Theodore E. Galanthay; Lisa K. Jorgenson; Robert D. McCutcheon

[57] ABSTRACT

An apparatus (and method) is provided that reduces noise in an embedded DRAM caused by noise in the Vdd supply. A circuit switches or decouples the bit line precharge voltage supply from the memory array to reduce noise in the memory array at time of bit line sensing. In addition, another circuit is utilized to switch or decouple the memory cell plate voltage supply from the memory array to reduce noise in the memory array at the time of bit line sensing. The circuit(s) includes a switch to perform the decoupling, or alternatively, include a switch coupled in parallel with a high impedance.

39 Claims, 3 Drawing Sheets

APPARATUS AND METHOD FOR NOISE REDUCTION IN DRAM

TECHNICAL FIELD

The present invention relates to dynamic random access memory (DRAM), and, in particular, to an apparatus and method for noise reduction in DRAMs.

BACKGROUND

Dynamic random access memory (DRAM) generally use a voltage supply of Vdd, or some other voltage proportional to Vdd, for precharge and equilibration of the bit lines prior to a read of the memory cell(s). In most current DRAM designs, the voltage supply used for precharge and equilibration is about one-half of Vdd (Vdd/2 supply). Use of the Vdd/2 supply has several advantages, including a reduction in peak currents at both sensing and bit-line precharge due to the half Vdd swing, and when folded bit lines are used, a reduction in noise coupling to the memory cell plate, the array substrate and word lines.

A typical DRAM cell includes a capacitor that stores a voltage level representing a logic zero or logic one. The other end of the capacitor is coupled to memory cell plate that runs throughout the memory array. The memory cell plate is typically biased at ground potential or some other voltage proportional to Vdd. In most current DRAM designs, the memory cell plate is coupled to a voltage supply equal to about one-half Vdd. The Vdd/2 bias on the memory cell plate has several advantages, including a reduction in the maximum voltage across the capacitor dielectric.

In a typical DRAM integrated circuit, virtually the entire integrated circuit is dedicated to the DRAM finction, including a relatively small amount of logic and peripheral circuitry used for I/O, selection and timing for the DRAM. Accordingly, the switching loads in a typical DRAM have less impact and relatively little noise is generated on the Vdd supply. Therefore, the Vdd power supply that provides the source for the VDD/2 supplies for the precharge/equilibration of the bit lines and the memory cell plate, is low in noise. In addition, some noise generated on the Vdd supply by operation of the DRAM is generally predictable and relatively stable, thus allowing designers to design its operation to reduce the effects of the noise. Given the low noise, a typical DRAM performs the sensing function substantially concurrently with the restore function. This provides a faster sensing operation.

When an integrated circuit includes substantial circuitry that performs many different and varying functions (e.g., processor, high-speed I/O, analog, etc.), the switching loads are high and random. Combining a DRAM into an application specific integrated circuit (ASIC), a processor-based integrated circuit, or as a relatively small portion of some other integrated circuit - commonly referred to as "embedded DRAM" presents many problems. One main problem is an increase in the amount of noise on the Vdd supply caused by the high switching loads. Another problem is the randomness of the switching loads (that is, the operation of the other circuitry on the IC may not be related to the operation of the DRAM on the IC). Due to this, it is very difficult to design the DRAM to reduce the effects of this noise. Moreover, the sensing of the bit lines in a DRAM is a very sensitive time.

Accordingly, there exists a need to reduce the noise in a DRAM in an integrated circuit. In addition, there is a need for a method and apparatus that reduces the effects of noise on a embedded DRAM.

SUMMARY OF THE INVENTION

According to the present invention, there is provided an apparatus for decreasing noise on a bit line of a DRAM during sensing of the bit line(s). The apparatus includes a circuit for decoupling a first voltage supply from a block of memory in a DRAM for a predetermined time period, with at least a portion of the predetermined time period occurring during the sensing of the bit line of the DRAM.

In accordance with the present invention, there is also provides a method for decreasing noise on a bit line of a DRAM during sensing of the bit line(s). The method precharges a plurality of bit lines in a block of memory in a DRAM substantially to a voltage level supplied by a first voltage supply by coupling the plurality of bit lines to the first voltage supply. The first voltage supply is decoupled from the plurality of bit lines and the first voltage supply is decouples from the block of memory. The plurality of bit lines are sensed at a time when the first voltage supply is decoupled from the block of memory.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is made to the following description taken in conjunction with the accompanying drawings, wherein.

DETAILED DESCRIPTION OF THE INVENTION

Figure 1:
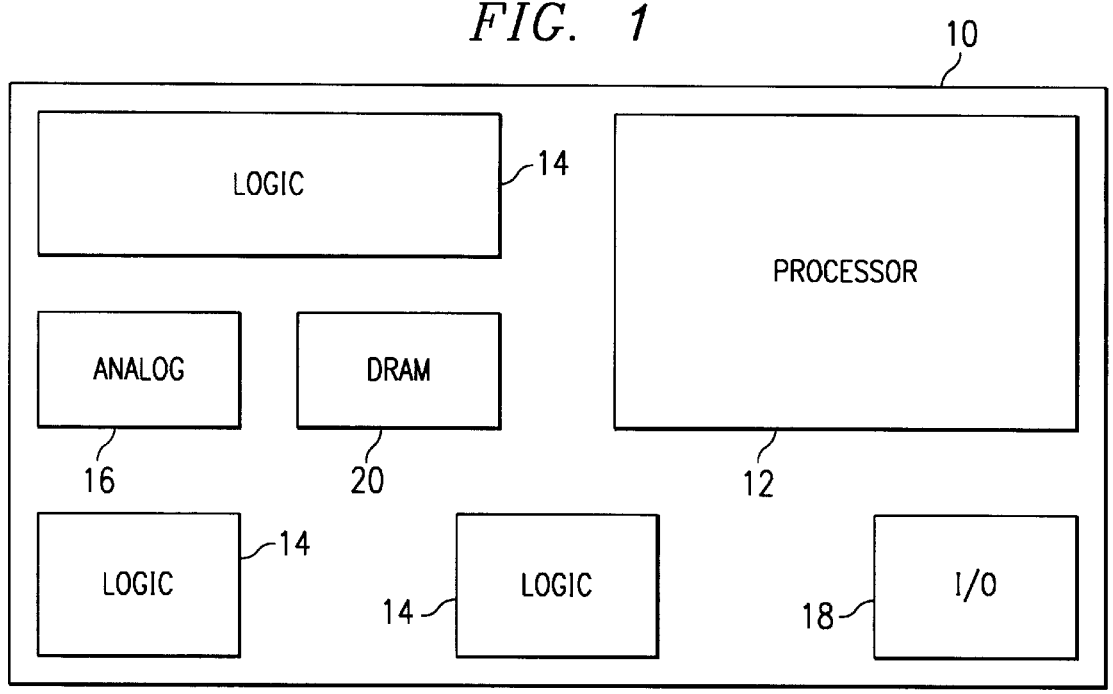
FIG. 1 is a block diagram illustrating an example of an integrated circuit including an embedded DRAM in accordance with the present invention.

With reference to the drawings, like reference characters designate like or similar elements throughout the drawings.

Now referring to FIG. 1, there is shown an integrated circuit 10 in accordance with the present invention. The integrated circuit 10 includes functional blocks of circuitry including a processor 12, several blocks of logic circuitry 14, analog circuitry 16, input/output (I/O) circuitry 18, and a dynamic random access memory (DRAM) 20. As will be appreciated, the general types and sizes of functional blocks included within integrated circuit 10 and shown in FIG. 1 are for illustrative purposes only, and the blocks 12, 14, 16, and 18 may include different circuitry that performs different functions.

Figure 2:
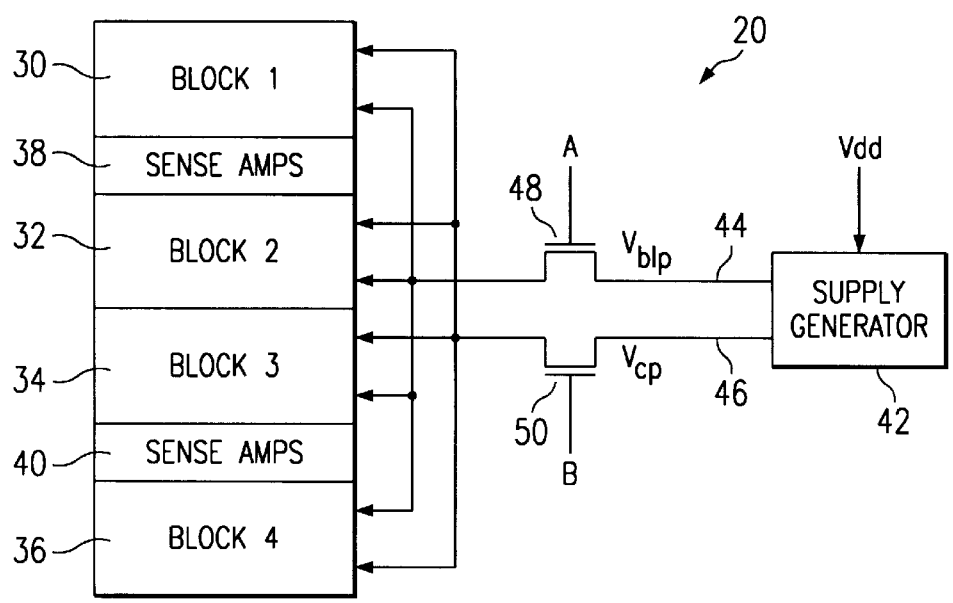
FIG. 2 is a detailed block and circuit diagram illustrating the embedded DRAM of the present invention.

Now referring to FIG. 2, there is shown a more detailed block and circuit diagram of the embedded DRAM 20 in accordance with the present invention. The DRAM 20 includes two memory blocks 30, 32 (each block having a number of memory cells) coupled to a block of shared sense amps 38. Additional memory blocks 34, 36 are also shown coupled to another block of shared sense amps 40. Optionally, each memory block may utilize its own block of sense amps. As will be appreciated, the number of memory blocks, as well as the number of memory cells within each block, may vary—depending on the desired size and architecture of the DRAM 20.

A voltage supply 42 receives Vdd from the Vdd source and generates and outputs voltage supply $V_{blp}$ and voltage supply $V_{cp}$, also identified by reference numerals 44 and 46, respectively. Voltage supply $V_{blp}$ provides a voltage source (or reference voltage or bias voltage) for the bit line precharge/equalization function in the memory blocks 30, 32, 34, 36 of the DRAM 20, as shown. Voltage supply $V_{cp}$ provides a voltage source (or reference voltage or bias voltage) for the memory cell plate bias function in the memory blocks 30, 32, 34, 36 of the DRAM 20, as shown. The voltage supplies $V_{blp}$ and $V_{cp}$ are usually designed to output voltage levels between Vdd and ground. In the preferred embodiment, the voltage output from the voltage supply $V_{blp}$ is about one-half Vdd, and the voltage output from the voltage supply $V_{cp}$ is about one-half Vdd.

The voltage supply 42 typically includes some type of voltage divider network or networks, such as a MOS device divider network, that utilizes Vdd as the source. As will be appreciated, any circuitry may be used to provide the voltage supply 42. In a preferred embodiment, the voltage supply 42 includes two MOS voltage dividers (one for each supply) having a low impedance output.

The present invention provides a circuit or switch 48 for decoupling the voltage supply from the memory blocks 30, 32, 34, 36 of the DRAM 20. Similarly, a circuit or switch 50 is provided for decoupling the voltage supply $V_{cp}$ from the memory blocks 30, 32, 34, 36 of the DRAM 20. A signal A controls the operation (couple/decouple) of the circuit 48 while a signal B controls the operation (couple/decouple) of the circuit 50. The signals A and B may be different signals, but preferably are the same signal. As will be appreciated, any type of circuits or switches may be used to decouple the voltage supplies $V_{blp}$ and $V_{cp}$ from the memory blocks 30, 32, 34, 36 of the DRAM 20.

Figure 3:
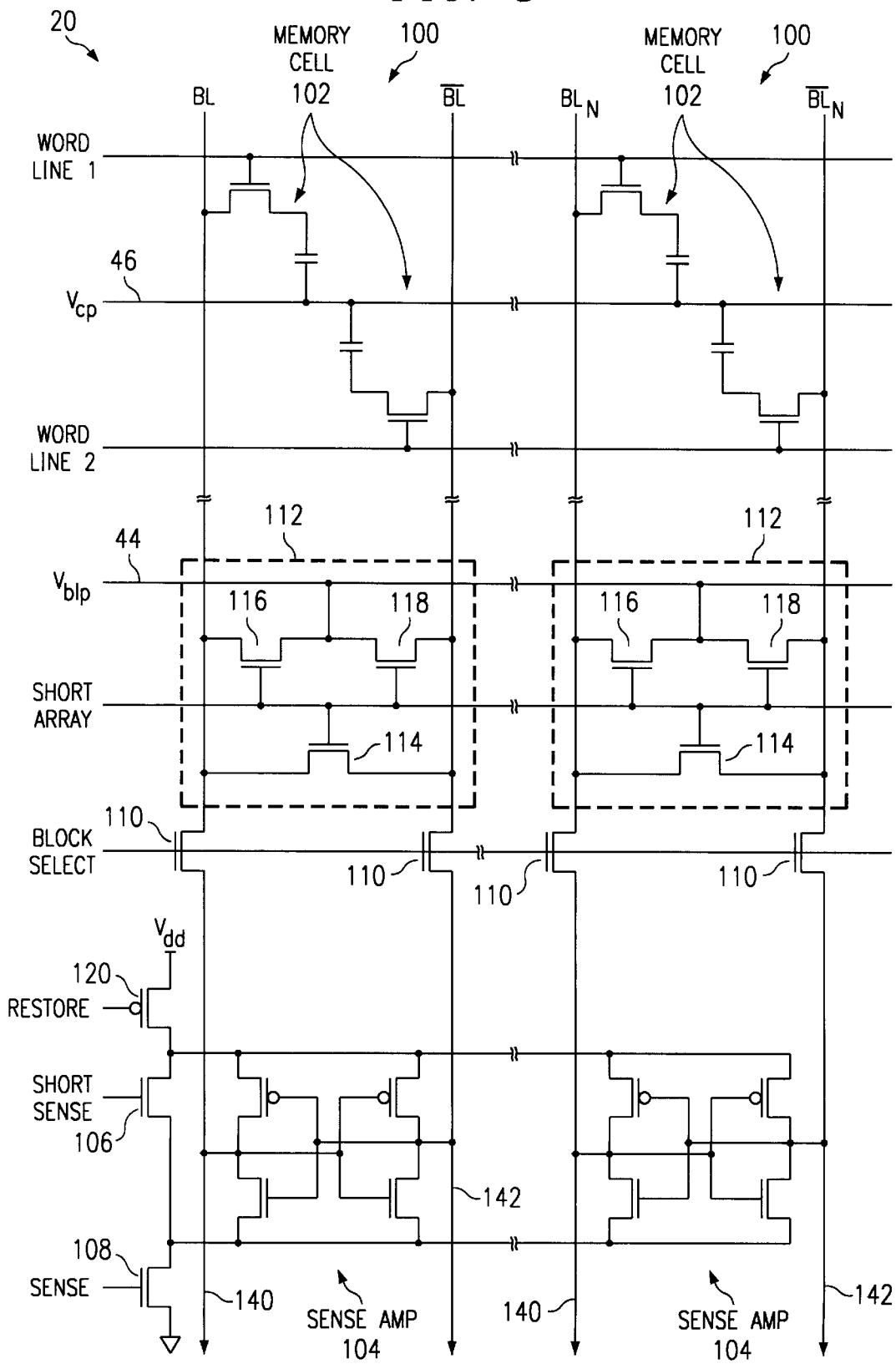
FIG. 3 is a circuit diagram illustrating memory columns for the embedded DRAM shown in FIG. 2.

Now referring to FIG. 3, there is shown a circuit diagram of two memory columns illustrative of memory columns in the embedded DRAM 20 shown in FIG. 2. Only circuitry needed for an understanding of the present invention is shown. Each of the columns 100 includes a plurality of memory cells 102, two bit lines identified as BL and $\overline{BL}$, a sense amp 104, and additional circuitry as shown. Additional circuitry may be included, such as dummy cells, reference circuitry and restore circuitry (not shown). Also shown in FIG. 3 are a transistor 106 for shorting the sense amps 104 and a transistor 108 for controlling the sensing of the bit lines by the sense amps 104. Block select transistors 110 provide coupling of the bit lines to the shared sense amps 104 for the selected memory block.

Each memory cell 102 includes a transistor and a capacitor. The memory cell capacitor stores a charge (representing a logic zero or a logic one) and the transistor couples the memory cell capacitor to the appropriate bit line. The other end of the memory cell capacitor is coupled to the voltage supply $V_{cp}$.

Each column 100 includes a precharge and equilibration circuit 112 having three switches 114, 116, 118. Switch 114 couples together the bit lines BL and $\overline{BL}$ of each column 100 when a short array signal is active. In addition, the switches 116 and 118 couple the voltage supply $V_{blp}$ to the bit lines. The voltage supply $V_{blp}$ provides leakage current to bit lines and precharges the bit lines. The precharge and equilibration circuit 112 functions to precharge and equilibrate the bit lines to the voltage level of the voltage supply $V_{blp}$. Precharge of the bit lines is performed prior to reading or writing (and refreshing) to the memory cells 102 of the DRAM 20. Operation of the memory cells 102 and the sense amps 104 is well known to those skilled in the art, and detailed description of such operation is not necessary for the complete understanding of the present invention.

Each sense amp 104 includes two sense amp nodes 140, 142. It will be understood that the sense amp nodes 140, 142 for each sense amp 104 may or may not be equilibrated and precharged by equilibration and precharge circuitry (not shown). This circuitry and function may be optional in the present invention, but is generally preferred.

It will be understood that electrical conductors within the memory blocks 30, 32, 34, 36 are utilized to distribute $V_{blp}$ to the bit line precharge circuitry 112 (see FIG. 3) within the memory blocks 30, 32, 34, 36. The precharge transistors 116, 118 (of each memory column) couple and decouple $V_{blp}$ from the bit lines. Also, electrical conductors within the memory blocks 30, 32, 34, 36 are utilized to distribute $V_{cp}$ to the memory cells 102 (see FIG. 3) within the memory blocks 30, 32, 34, 36.

During sensing of the bit lines in a read operation, the sense amp 104 detects a small voltage differential between the bit lines BL and $\overline{BL}$. This voltage differential is amplified by the sense amps and the bit lines BL and $\overline{BL}$ have voltage levels of logic zero and logic one (or vice versa, depending on the value stored in the memory cell being read). Sensing of the bit lines is a critical time during the read operation. Because the voltage differential is small, any noise coupled to the bit lines affects the sensing operation. In the embedded DRAM 20, the Vdd supply is powering many different functional blocks 12, 14, 16, 18 (see FIG. 1) that result in differing switching loads occurring at different times. This causes significant noise on the Vdd supply which is coupled to the voltage supplies $V_{blp}$ and $V_{cp}$. In addition, the blocks 12, 14, 16, 18 operate substantially independent of the DRAM 20, therefore, increasing the noise during the sensing operation of the DRAM 20. While a large differential in the bit lines is desired to negate the noise effects, a large differential is difficult to achieve. The present invention provides a means and method for reducing noise coupled to the bit lines during the sensing operation of the DRAM 20.

Figure 4:
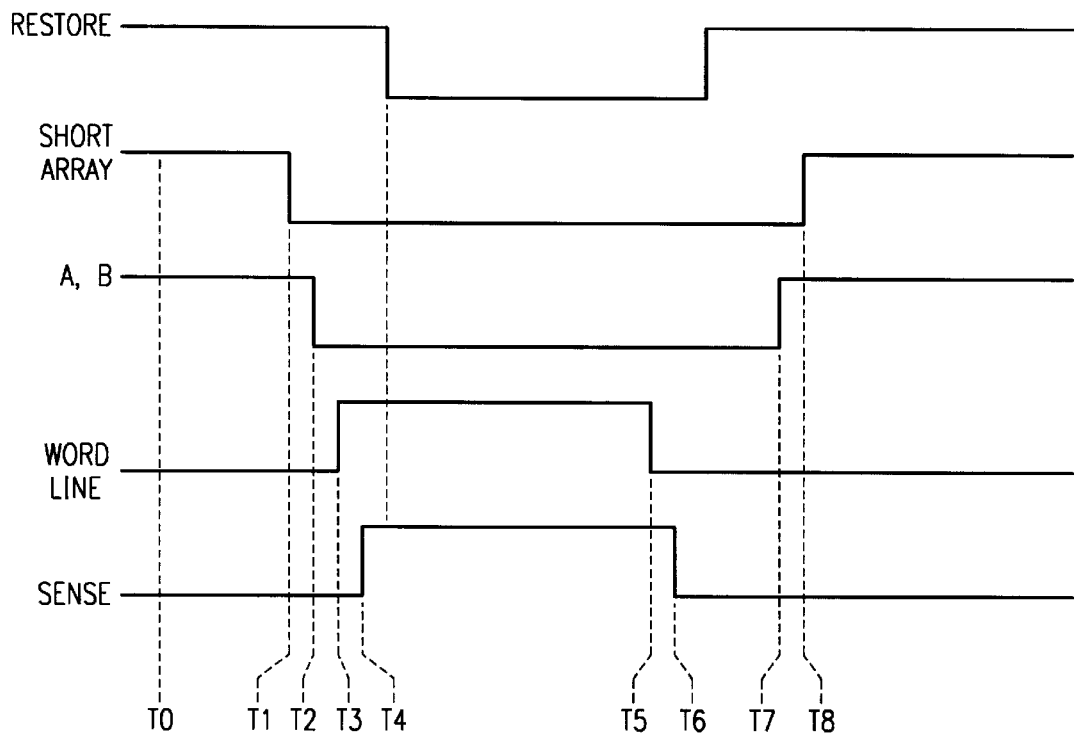
FIG. 4 is a timing diagram illustrating operation of the DRAM during a write/read/refresh operation.

Now referring to FIG. 4, and also continued reference to FIGS. 2 and 3, there is shown a timing diagram illustrating operation of the DRAM 20 during a read operation (or refresh operation, which utilizes a read operation) in accordance with a preferred embodiment of the present invention. At a time T0, the short array signal is active and the bit lines are precharged (and equilibrated) to the voltage supply $V_{blp}$. (As described above, the sense amp nodes 140, 142 may also be precharged and equilibrated). Meanwhile, the voltage supplies $V_{blp}$ and $V_{cp}$ are coupled to the memory blocks 30, 32, 34, 36, and the word line is low and the sense amps 104 are off. At a time T1, the short array signal goes low in anticipation of bit line sensing and decouples the bit lines BL and $\overline{BL}$ from each other and decouples the voltage supply $V_{blp}$ from the bit lines.

At a time T2, the present invention decouples the voltage supply $V_{blp}$ from the memory blocks 30, 32, 34, 36 in response to signal A, thereby reducing capacitance to the bit lines and further reducing or eliminating noise apparent on Vdd from coupling to the bit lines. Also, the voltage supply $V_{cp}$ is decoupled from the memory blocks 30, 32, 34, 36 in response to signal B resulting in similar advantages. The present invention decouples (or switches out) the voltage supply $V_{blp}$ to the memory array prior to sensing of the bit lines. This reduces bit line noise during sense, where the noise is generally caused by noise on the Vdd supply (and/or the $V_{blp}$ supply). For similar reasons, present invention also decouples (or switches out) the voltage supply $V_{cp}$ to the memory array prior to sensing of the bit lines. As will be appreciated, a person of ordinary skill in the art may use any circuitry or means to generate the signals A and B, and the signals can be generated using the short array signal.

At a time T3, the appropriate word line is activated to access the desired memory cell(s). Thereafter, at a time T4, the sense amp(s) 104 are activated (or turned on) in response to the sense signal. The bit lines are sensed during the sensing operation and appropriate voltage levels are generated on the bit lines. After sensing is activated (or turned on), a restore transistor 120 (see FIG. 3) is turned on to supply Vdd to the sense amps 104. While the restore function may be performed concurrently with the sensing function, it is preferred to design the sensing flnction and the to occur sequentially.

The active word line is then turned off at a time T5, and the sensing operation is turned off at a time T6. After the bit line sensing operation is terminated, the voltage supply $V_{blp}$ and the voltage supply $V_{cp}$ are coupled to the memory blocks 30, 32, 34, 36 at a time T7. At a time T8, the bit lines are again precharged (and equilibrated) for the next read/refresh cycle.

Optionally, the voltage supply $V_{blp}$ and the supply $V_{cp}$ may be re-coupled to the memory blocks 30, 32, 34, 36 at an earlier time but after the bit lines have been restored to the appropriate voltage levels to restore the original data into the memory cell(s). In addition, the decoupling of the voltage supply(ies) can occur substantially concurrent with the deactivation of the precharge function and/or be initiated or activated by, or in response to the shorting signal(s) (precharge).

The present invention limits noise into the DRAM array during the time of bit line sensing. This is accomplished by decoupling the voltage supply $V_{blp}$ from the memory array during sensing. Additional noise reduction can be accomplished by also decoupling the voltage supply $V_{cp}$ from the memory array.

Figure 5:
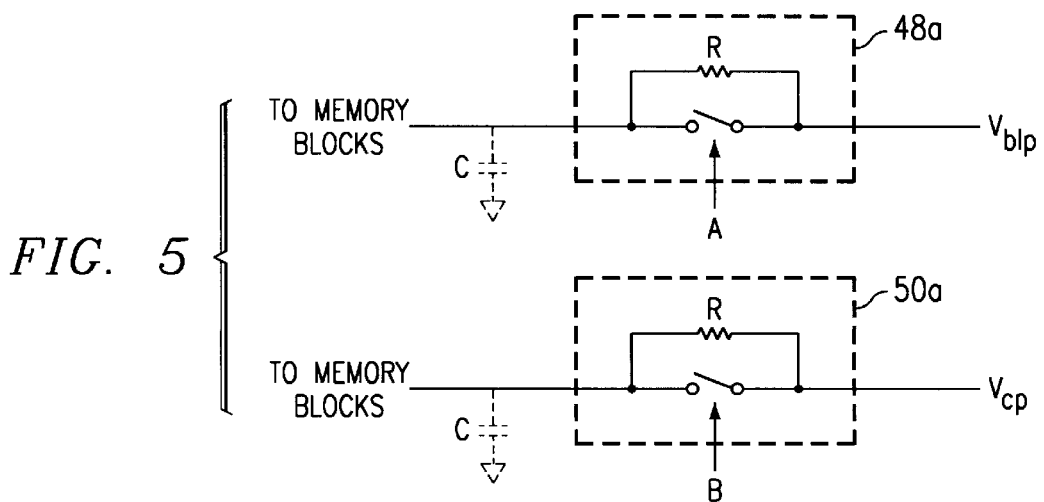
FIG. 5 is a circuit diagram illustrating an alternative embodiment of the embedded DRAM of the present invention.

Now referring to FIG. 5, there is illustrated an alternative embodiment of the circuits 48, 50 for decoupling the voltage supplies $V_{blp}$ and $V_{cp}$ from the memory blocks 30, 32, 34, 36. Each of the circuits 48a, 50a include a switch and an impedance R in parallel with the switch. The circuits 48a, 50a operate to decouple the voltage supplies $V_{blp}$ and $V_{cp}$ by inserting a series impedance in the $V_{blp}$ and $V_{cp}$ lines. Thus, during bit line sensing, an RC filter is utilized to filter out some of the noise on the voltage supplies $V_{blp}$ and $V_{cp}$ before reaching the memory blocks 30, 32, 34, 36 (the capacitance C is the capacitance of the signal lines, and the value of C is dependent on the characteristics/architecture of the conductor lines carrying the voltage supplies $V_{blp}$ and $V_{cp}$ and the surrounding environment.

Although the present invention and its advantages have been described in the foregoing detailed description and illustrated in the accompanying drawings, it will be understood by those skilled in the art that the invention is not limited to the embodiment(s) disclosed but is capable of numerous rearrangements, substitutions and modifications without departing from the spirit and scope of the invention as defined by the appended claims.

What is claimed is:

1. An apparatus for decreasing noise on a bit line in a memory during sensing of the bit line, the apparatus comprising:
    means for decoupling a first voltage supply from a block of memory for a predetermined time period, with at least a portion of the predetermined time period occurring during the sensing of the bit line.
2. The apparatus in accordance with claim 1 wherein the means for decoupling comprises a switch.
3. The apparatus in accordance with claim 1 wherein the means for decoupling comprises:
    a switch; and
    an impedance in parallel with the switch.
4. The apparatus in accordance with claim 1 wherein the first voltage supply provides a voltage source to precharge the bit line.
5. The apparatus in accordance with claim 4 wherein the means for decoupling comprises a switch.
6. The apparatus in accordance with claim 4 wherein the means for decoupling comprises:
    a switch; and
    an impedance in parallel with the switch.
7. The apparatus in accordance with claim 1 wherein the first voltage supply provides a voltage source for biasing a memory cell plate.
8. The apparatus in accordance with claim 7 wherein the means for decoupling comprises a switch.
9. The apparatus in accordance with claim 7 wherein the means for decoupling comprises:
    a switch; and
    an impedance in parallel with the switch.
10. The apparatus in accordance with claim 1 further comprising:
    means for decoupling a second voltage supply from a block of memory for a predetermined time period, with at least a portion of the predetermined time period occurring during the sensing of the bit line.
11. The apparatus in accordance with claim 10 wherein the first voltage supply provides a voltage source to precharge the bit line and the second voltage supply provides a voltage source for biasing a memory cell plate.
12. The apparatus in accordance with claim 11 wherein the means for decoupling the first voltage supply comprises a switch and the means for decoupling the second voltage supply comprises a switch.
13. The apparatus in accordance with claim 1 further comprising a circuit for coupling the first voltage supply to the bit line to precharge the bit line.
14. An apparatus for decreasing noise on a bit line in a memory during sensing of the bit line, the apparatus comprising:
    a circuit for decoupling a first voltage supply from a block of memory for a predetermined time period, with at least a portion of the predetermined time period occurring during the sensing of the bit line.
15. The apparatus in accordance with claim 14 wherein the circuit for decoupling comprises a switch.
16. The apparatus in accordance with claim 14 wherein the first voltage supply provides a voltage source to precharge the bit line.
17. The apparatus in accordance with claim 14 wherein the first voltage supply provides a voltage source for biasing a memory cell plate.

18. The apparatus in accordance with claim 14 further comprising:

a circuit for decoupling a second voltage supply from a block of memory for a predetermined time period, with at least a portion of the predetermined time period occurring during the sensing of the bit line, and wherein the first voltage supply provides a voltage source to precharge the bit line and the second voltage supply provides a voltage source for biasing a memory cell plate.

19. A method for decreasing noise on a bit line in a memory during sensing of the bit line, comprising the steps of:

precharging a plurality of bit lines in a block of memory substantially to a voltage level supplied by a first voltage supply by coupling the plurality of bit lines to the first voltage supply;

decoupling the first voltage supply from the plurality of bit lines;

decoupling the first voltage supply from the block of memory; and sensing the plurality of bit lines at a time when the first voltage supply is decoupled from the block of memory.

20. The method in accordance with claim 19 further comprising the steps of:

biasing a plurality of memory cells in the block of memory substantially to a voltage level supplied by a second voltage supply by coupling the plurality of memory cells to the second voltage supply;

decoupling the second voltage supply from the plurality of memory cells; and wherein the step of sensing the plurality of bit lines occurs at a time when the second voltage supply is decoupled from the block of memory.

21. The apparatus in accordance with claim 1 wherein the block of memory comprises DRAM.

22. The apparatus in accordance with claim 14 wherein the block of memory comprises DRAM.

23. The method in accordance with claim 19 wherein the block of memory comprises DRAM.

24. A method for decreasing noise on a bit line in a memory during sensing of the bit line, comprising the steps of:

biasing a plurality of memory cells in the block of memory substantially to a voltage level supplied by a first voltage supply by coupling the plurality of memory cells to the first voltage supply;

decoupling the first voltage supply from the plurality of memory cells; and sensing a bit line coupled to a one of the plurality of memory cells at a time when the first voltage supply is decoupled from the block of memory.

25. The method in accordance with claim 24 wherein the block memory comprises DRAM.

26. An apparatus for decreasing noise on a bit line in a memory during sensing of the bit line, the apparatus comprising:

a block of memory; and means for decoupling a first voltage supply from the block of memory for a predetemined time period, with at least a portion of the predetermined time period occurring during the sensing of the bit line.

27. The apparatus in accordance with claim 26 wherein the means for decoupling comprises a switch.

28. The apparatus in accordance with claim 26 wherein the first voltage supply provides a voltage source to precharge the bit line.

29. The apparatus in accordance with claim 26 wherein the first voltage supply provides a voltage source for biasing a memory cell plate.

30. The apparatus in accordance with claim 29 wherein the means for decoupling comprises a switch.

31. The apparatus in accordance with claim 26 further comprising:

means for decoupling a second voltage supply from the block of memory for a predetermined time period, with at least a portion of the predetermined time period occurring during the sensing of the bit line.

32. The apparatus in accordance with claim 31 wherein the first voltage supply provides a voltage source to precharge the bit line and the second voltage supply provides a voltage source for biasing a memory cell plate.

33. The apparatus in accordance with claim 26 wherein the block of memory comprises DRAM.

34. An apparatus for decreasing noise on a bit line in a memory during sensing of the bit line, the apparatus comprising:

a block of memory; and a circuit for decoupling a first voltage supply from the block of memory for a predetermined time period, with at least a portion of the predetermined time period occurring during the sensing of the bit line.

35. The apparatus in accordance with claim 34 wherein the means for decoupling comprises a switch.

36. The apparatus in accordance with claim 34 further comprising:

a circuit for decoupling a second voltage supply from a block of memory for a predetermined time period, with at least a portion of the predetermined time period occurring during the sensing of the bit line, and wherein the first voltage supply provides a voltage source to precharge the bit line and the second voltage supply provides a voltage source for biasing a memory cell plate.

37. The apparatus in accordance with claim 36 wherein the block of memory comprises DRAM.

38. An integrated circuit comprising:

an apparatus for decreasing noise on a bit line in a memory during sensing of the bit line, the apparatus comprising;

a block of memory, and means for decoupling a first voltage supply from the block of memory for a predetermined time period, with at least a portion of the predetermined time period occurring during the sensing of the bit line; and a processor.

39. The integrated circuit in accordance with claim 38 wherein the means for decoupling comprises a switch.

* * * * *